United States Patent
Chen (10) Patent No.: US 6,539,513 B1
(45) Date of Patent: *Mar. 25, 2003

(54) DUAL FUNCTIONING SYMBOL ERROR CORRECTION CODE

(75) Inventor: Chin-Long Chen, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/417,948

(22) Filed: Oct. 13, 1999

(51) Int. Cl.[7] ................ H03M 13/00; G11C 29/00
(52) U.S. Cl. .............. 714/758; 714/763; 714/781
(58) Field of Search ..................... 714/752, 758, 714/766, 767, 772, 763, 781

(56) References Cited

U.S. PATENT DOCUMENTS 5,745,507 A * 4/1998 Chen ........................ 714/763
5,757,823 A * 5/1998 Chen et al. ................. 714/752
6,009,548 A * 12/1999 Chen et al. ................. 714/762

OTHER PUBLICATIONS

Symbol Error Correcting Codes for Memory Application, C. L. Chen, Proceedings of the Twenty–Sixth International Symposium on Fault–Tolerant Computing, Jun. 25–27, 1996, pp. 201–207.
A System Solution to Reducing Frequency of Memory Repairs, C. L. Chen and M. Y. Hsiao, Proceedings Pacific Rim International Symposium on Fault–Tolerant Systems, Dec. 15–16, 1997, pp. 53–58.

* cited by examiner

Primary Examiner—Emmanuel L. Moise
(74) Attorney, Agent, or Firm—Lawrence D. Cutter; Cantor Colburn LLP (57) ABSTRACT

A method for constructing a single ECC that incorporates two codes into one is presented. This single ECC configuration can be applied to a memory configured in 2-bit-per-chip or 4-bit-per-chip. A mode bit M is used to indicate one of the two memory configurations.

9 Claims, 7 Drawing Sheets

ECC GEN MATRIX (BITS 1 THROUGH 40)

| SYMBOL ID | 1 | 2 | 3 | 4 | 5 | 6 | 7 | 8 | 9 | 10 |
|---|---|---|---|---|---|---|---|---|---|---|
| BIT ID | 1234 | 5678 | 111 9012 | 1111 3456 | 1112 7890 | 2222 1234 | 2222 5678 | 2333 9012 | 3333 3456 | 3334 7890 |
| C1 | 1110 | 1100 | 1010 | 0111 | 1110 | 0101 | 1011 | 0001 | 0110 | 0111 |
| C2 | 1001 | 1000 | 0101 | 1110 | 1001 | 1111 | 0110 | 0011 | 1101 | 1110 |
| C3 | 0110 | 0011 | 0111 | 1011 | 0110 | 1110 | 1000 | 1111 | 0100 | 1011 |
| C4 | 1101 | 0010 | 1110 | 0110 | 1101 | 1001 | 0100 | 1010 | 1100 | 0110 |
| C5 | 0000 | 1001 | 0010 | 1001 | 1110 | 1011 | 0000 | 0011 | 0010 | 1111 |
| C6 | 0000 | 0111 | 0001 | 0111 | 1001 | 0110 | 0000 | 0010 | 0001 | 1010 |
| C7 | 0000 | 1101 | 0101 | 1101 | 0110 | 1000 | 0000 | 1010 | 0101 | 1001 |
| C8 | 0000 | 1011 | 1111 | 1011 | 1101 | 0100 | 0000 | 0101 | 1111 | 0111 |
| C9 | 0110 | 1101 | 0000 | 0110 | 1000 | 0110 | 0011 | 1010 | 1100 | 0000 |
| C10 | 1101 | 1011 | 0000 | 1101 | 0100 | 1101 | 0010 | 0101 | 1000 | 0000 |
| C11 | 0100 | 1100 | 0000 | 0100 | 0010 | 0100 | 1010 | 0111 | 0011 | 0000 |
| C12 | 1100 | 1000 | 0000 | 1100 | 0001 | 1100 | 0101 | 1110 | 0010 | 0000 |
| C13 | 1000 | 1000 | 1110 | 0010 | 1000 | 0010 | 1110 | 1000 | 1010 | 1100 |
| C14 | 0100 | 0100 | 1001 | 0001 | 0100 | 0001 | 1001 | 0100 | 0101 | 1000 |
| C15 | 0010 | 0010 | 0110 | 0101 | 0010 | 0101 | 0110 | 0010 | 0111 | 0011 |
| C16 | 0001 | 0001 | 1101 | 1111 | 0001 | 1111 | 1101 | 0001 | 1110 | 0010 |

FIG. 1A

ECC GEN MATRIX (BITS 41 THROUGH 80)

| SYMBOL ID | 11 | 12 | 13 | 14 | 15 | 16 | 17 | 18 | 19 | 20 |
|---|---|---|---|---|---|---|---|---|---|---|
| BIT ID | 4444 1234 | 4444 5678 | 4555 9012 | 5555 3456 | 5556 7890 | 6666 1234 | 6666 5678 | 6777 9012 | 7777 3456 | 7778 7890 |
| C1 | 0011 | 1011 | 1110 | 1000 | 1100 | 1000 | 0000 | 0000 | 1111 | 0011 |
| C2 | 0010 | 0110 | 1001 | 0100 | 1000 | 0100 | 0000 | 0000 | 1010 | 0010 |
| C3 | 1010 | 1000 | 0110 | 0010 | 0011 | 0010 | 0000 | 0000 | 1001 | 1010 |
| C4 | 0101 | 0100 | 1101 | 0001 | 0010 | 0001 | 0000 | 0000 | 0111 | 0101 |
| C5 | 1011 | 1110 | 0001 | 0011 | 1000 | 1100 | 1111 | 0010 | 1111 | 0011 |
| C6 | 0110 | 1001 | 0011 | 0010 | 0100 | 1000 | 1010 | 0001 | 1010 | 0010 |
| C7 | 1000 | 0110 | 1111 | 1010 | 0010 | 0011 | 1001 | 0101 | 1001 | 1010 |
| C8 | 0100 | 1101 | 1010 | 0101 | 0001 | 0010 | 0111 | 1111 | 0111 | 0101 |
| C9 | 0000 | 1101 | 0111 | 0011 | 1100 | 1100 | 0111 | 1010 | 1000 | 1000 |
| C10 | 0000 | 1011 | 1110 | 0010 | 1000 | 1000 | 1110 | 0101 | 0100 | 0100 |
| C11 | 0000 | 1100 | 1011 | 1010 | 0011 | 0011 | 1011 | 0111 | 0010 | 0010 |
| C12 | 0000 | 1000 | 0110 | 0101 | 0010 | 0010 | 0110 | 1110 | 0001 | 0001 |
| C13 | 1000 | 0000 | 0100 | 0010 | 0000 | 0011 | 0101 | 1100 | 1000 | 0101 |
| C14 | 0100 | 0000 | 1100 | 0001 | 0000 | 0010 | 1111 | 1000 | 0100 | 1111 |
| C15 | 0010 | 0000 | 0001 | 0101 | 0000 | 1010 | 1110 | 0011 | 0010 | 1110 |
| C16 | 0001 | 0000 | 0011 | 1111 | 0000 | 0101 | 1001 | 0010 | 0001 | 1001 |

FIG. 5C. PART OF ECC GEN MATRIX (BITS 81 THROUGH 120)

FIG. 1B

ECC GEN MATRIX (BITS 81 THROUGH 120)

| SYMBOL ID | 21 | 22 | 23 | 4 | 25 | 26 | 27 | 28 | 29 | 30 |
|---|---|---|---|---|---|---|---|---|---|---|
| BIT ID | 8888 8888 1234 | 8888 8888 5678 | 8999 8999 9012 | 9999 9999 3456 | 1 9990 9990 7890 | 1111 0000 1234 | 1111 0000 5678 | 1111 0111 9012 | 1111 1111 3456 | 1111 1112 7890 |
| C1  | 0010 | 1101 | 1100 | 0001 | 0111 | 0110 | 1111 | 1000 | 0010 | 1011 |
| C2  | 0001 | 1011 | 1000 | 0011 | 1110 | 1101 | 1010 | 0100 | 0001 | 0110 |
| C3  | 0101 | 1100 | 0011 | 1111 | 1011 | 0100 | 1001 | 0010 | 0101 | 1000 |
| C4  | 1111 | 1000 | 0010 | 1010 | 0110 | 1100 | 0111 | 0001 | 1111 | 0100 |
| C5  | 1101 | 1001 | 0011 | 0110 | 1011 | 0110 | 1000 | 1010 | 0100 | 1101 |
| C6  | 1011 | 0111 | 0010 | 1101 | 0110 | 1101 | 0100 | 0101 | 1100 | 1011 |
| C7  | 1100 | 1101 | 1010 | 0100 | 1000 | 0100 | 0010 | 0111 | 0001 | 1100 |
| C8  | 1000 | 1011 | 0101 | 1100 | 0100 | 1100 | 0001 | 1110 | 0011 | 1000 |
| C9  | 0111 | 1100 | 0111 | 1111 | 0100 | 1000 | 1111 | 1010 | 1110 | 1110 |
| C10 | 1110 | 1000 | 1110 | 1010 | 1100 | 0100 | 1010 | 0101 | 1001 | 1001 |
| C11 | 1011 | 0011 | 1011 | 1001 | 0001 | 0010 | 1001 | 0111 | 0110 | 0110 |
| C12 | 0110 | 0010 | 0110 | 0111 | 0011 | 0001 | 0111 | 1110 | 1101 | 1101 |
| C13 | 0001 | 1101 | 0000 | 0000 | 0100 | 1111 | 0011 | 0000 | 1101 | 0110 |
| C14 | 0011 | 1011 | 0000 | 0000 | 1100 | 1010 | 0010 | 0000 | 1011 | 1101 |
| C15 | 1111 | 1100 | 0000 | 0000 | 0001 | 1001 | 1010 | 0000 | 1100 | 0100 |
| C16 | 1010 | 1000 | 0000 | 0000 | 0011 | 0111 | 0101 | 0000 | 1000 | 1100 |

FIG. 1C

ECC GEN MATRIX (BITS 121 THROUGH 148 WITH CHECK BITS: 129-144)

| SYMBOL ID | 31 | 32 | 33 | 34 | 35 | 36 | 37 |
|---|---|---|---|---|---|---|---|
| BIT ID | 1111 2222 1234 | 1111 2222 5678 | 1111 2333 9012 | 1111 3333 3456 | 1111 3334 7890 | 1111 4444 1234 | 1111 4444 5678 |
| C1  | 0110 | 1010 | 1000 | 0000 | 0000 | 1100 | 0101 |
| C2  | 1101 | 0101 | 0100 | 0000 | 0000 | 1000 | 1111 |
| C3  | 0100 | 0111 | 0010 | 0000 | 0000 | 0011 | 1110 |
| C4  | 1100 | 1110 | 0001 | 0000 | 0000 | 0010 | 1001 |
| C5  | 1101 | 1110 | 0000 | 1000 | 0000 | 0010 | 1110 |
| C6  | 1011 | 1001 | 0000 | 0100 | 0000 | 0001 | 1001 |
| C7  | 1100 | 0110 | 0000 | 0010 | 0000 | 0101 | 0110 |
| C8  | 1000 | 1101 | 0000 | 0001 | 0000 | 1111 | 1101 |
| C9  | 0011 | 1100 | 0000 | 0000 | 1000 | 0110 | 0011 |
| C10 | 0010 | 1000 | 0000 | 0000 | 0100 | 1101 | 0010 |
| C11 | 1010 | 0011 | 0000 | 0000 | 0010 | 0100 | 1010 |
| C12 | 0101 | 0010 | 0000 | 0000 | 0001 | 1100 | 0101 |
| C13 | 0010 | 0000 | 0000 | 0000 | 0000 | 1000 | 1110 |
| C14 | 0001 | 0000 | 0000 | 0000 | 0000 | 0100 | 1001 |
| C15 | 0101 | 0000 | 0000 | 0000 | 0000 | 0010 | 0110 |
| C16 | 1111 | 0000 | 0000 | 0000 | 0000 | 0001 | 1101 |

SYNDROME GEN MATRIX (BITS 1 THROUGH 40)

| SYMBOL ID | 1 | 2 | 3 | 4 | 5 | 6 | 7 | 8 | 9 | 10 |
|---|---|---|---|---|---|---|---|---|---|---|
| BIT ID | 1234 | 5678 | 111<br>9012 | 1111<br>3456 | 1112<br>7890 | 2222<br>1234 | 2222<br>5678 | 2333<br>9012 | 3333<br>3456 | 3334<br>7890 |
| S1  | 1000 | 1000 | 1000 | 1000 | 1000 | 1000 | 1000 | 1000 | 1000 | 1000 |
| S2  | 0100 | 0100 | 0100 | 0100 | 0100 | 0100 | 0100 | 0100 | 0100 | 0100 |
| S3  | 0010 | 0010 | 0010 | 0010 | 0010 | 0010 | 0010 | 0010 | 0010 | 0010 |
| S4  | 0001 | 0001 | 0001 | 0001 | 0001 | 0001 | 0001 | 0001 | 0001 | 0001 |
| S5  | 0100 | 1100 | 0000 | 0100 | 0010 | 0100 | 1010 | 0111 | 0011 | 0000 |
| S6  | 1100 | 1000 | 0000 | 1100 | 0001 | 1100 | 0101 | 1110 | 0010 | 0000 |
| S7  | 0010 | 0001 | 0000 | 0010 | 1010 | 0010 | 1001 | 1101 | 1111 | 0000 |
| S8  | 0001 | 0011 | 0000 | 0001 | 0101 | 0001 | 0111 | 1011 | 1010 | 0000 |
| S9  | 0011 | 1010 | 0000 | 0000 | 0000 | 0110 | 1011 | 0001 | 1001 | 1010 |
| S10 | 0010 | 0101 | 0000 | 0000 | 0000 | 1101 | 0110 | 0011 | 0111 | 0101 |
| S11 | 0101 | 1110 | 0000 | 0000 | 0000 | 1100 | 0100 | 1010 | 1011 | 1110 |
| S12 | 1111 | 1001 | 0000 | 0000 | 0000 | 1000 | 1100 | 0101 | 0110 | 1001 |
| S13 | 0111 | 1010 | 0000 | 0100 | 1010 | 1101 | 0010 | 1110 | 1000 | 1100 |
| S14 | 1110 | 0101 | 0000 | 1100 | 0101 | 1011 | 0001 | 1001 | 0100 | 1000 |
| S15 | 1101 | 1001 | 0000 | 0010 | 1001 | 0100 | 1010 | 1011 | 0011 | 0001 |
| S16 | 1011 | 0111 | 0000 | 0001 | 0111 | 1100 | 0101 | 0110 | 0010 | 0011 |

FIG. 3A

SYNDROME GEN MATRIX (BITS 41 THROUGH 80)

| SYMBOL ID | 11 | 12 | 13 | 14 | 15 | 16 | 17 | 18 | 19 | 20 |
|---|---|---|---|---|---|---|---|---|---|---|
| BIT ID | 4444<br>1234 | 4444<br>5678 | 4555<br>9012 | 5555<br>3456 | 5556<br>7890 | 6666<br>1234 | 6666<br>5678 | 6777<br>9012 | 7777<br>3456 | 7778<br>7890 |
| S1  | 1000 | 1000 | 1000 | 1000 | 1000 | 1000 | 1000 | 1000 | 1000 | 1000 |
| S2  | 0100 | 0100 | 0100 | 0100 | 0100 | 0100 | 0100 | 0100 | 0100 | 0100 |
| S3  | 0010 | 0010 | 0010 | 0010 | 0010 | 0010 | 0010 | 0010 | 0010 | 0010 |
| S4  | 0001 | 0001 | 0001 | 0001 | 0001 | 0001 | 0001 | 0001 | 0001 | 0001 |
| S5  | 0000 | 1100 | 1011 | 1010 | 0011 | 0011 | 1011 | 0111 | 0010 | 0010 |
| S6  | 0000 | 1000 | 0110 | 0101 | 0010 | 0010 | 0110 | 1110 | 0001 | 0001 |
| S7  | 0000 | 0001 | 1100 | 1001 | 1111 | 1111 | 1100 | 1101 | 1010 | 1010 |
| S8  | 0000 | 0011 | 1000 | 0111 | 1010 | 1010 | 1000 | 1011 | 0101 | 0101 |
| S9  | 0011 | 1000 | 1000 | 0000 | 0001 | 1000 | 1001 | 1100 | 1101 | 1010 |
| S10 | 0010 | 0100 | 0100 | 0000 | 0011 | 0100 | 0111 | 1000 | 1011 | 0101 |
| S11 | 0101 | 0001 | 0001 | 0000 | 1010 | 0001 | 1011 | 0010 | 1000 | 1110 |
| S12 | 1111 | 0011 | 0011 | 0000 | 0101 | 0011 | 0110 | 0001 | 0100 | 1001 |
| S13 | 1001 | 1011 | 0111 | 0110 | 0101 | 1000 | 0010 | 0110 | 1101 | 1011 |
| S14 | 0111 | 0110 | 1110 | 1101 | 1111 | 0100 | 0001 | 1101 | 1011 | 0110 |
| S15 | 0110 | 1100 | 1101 | 1000 | 0111 | 0011 | 1010 | 1000 | 0100 | 1100 |
| S16 | 1101 | 1000 | 1001 | 0100 | 1110 | 0010 | 0101 | 0100 | 1100 | 1000 |

FIG. 6C. SYNDROME GEN MATRIX (BITS *1 THROUGH 120)

FIG. 3B

SYNDROME GEN MATRIX (BITS 81 THROUGH 120)

| SYMBOL ID | 21 | 22 | 23 | 24 | 25 | 26 | 27 | 28 | 29 | 30 |
|---|---|---|---|---|---|---|---|---|---|---|
| BIT ID | 8888 1234 | 8888 5678 | 8999 9012 | 9999 3456 | 1 9990 7890 | 1111 0000 1234 | 1111 0000 5678 | 1111 0111 9012 | 1111 1111 3456 | 1111 1112 7890 |
| S1  | 1000 | 1000 | 1000 | 1000 | 1000 | 1000 | 1000 | 1000 | 1000 | 1000 |
| S2  | 0100 | 0100 | 0100 | 0100 | 0100 | 0100 | 0100 | 0100 | 0100 | 0100 |
| S3  | 0010 | 0010 | 0010 | 0010 | 0010 | 0010 | 0010 | 0010 | 0010 | 0010 |
| S4  | 0001 | 0001 | 0001 | 0001 | 0001 | 0001 | 0001 | 0001 | 0001 | 0001 |
| S5  | 1011 | 0011 | 1011 | 1001 | 0001 | 0010 | 1001 | 0111 | 0110 | 0110 |
| S6  | 0110 | 0010 | 0110 | 0111 | 0011 | 0001 | 0111 | 1110 | 1101 | 1101 |
| S7  | 1100 | 1111 | 1100 | 0110 | 0101 | 1010 | 0110 | 1101 | 1000 | 1000 |
| S8  | 1000 | 1010 | 1000 | 1101 | 1111 | 0101 | 1101 | 1011 | 0100 | 0100 |
| S9  | 1111 | 1100 | 1110 | 1101 | 1101 | 1110 | 1100 | 0010 | 1101 | 1110 |
| S10 | 1010 | 1000 | 1001 | 1011 | 1011 | 1001 | 1000 | 0001 | 1011 | 1001 |
| S11 | 0111 | 0010 | 1101 | 1000 | 1000 | 1101 | 0010 | 1111 | 1000 | 1101 |
| S12 | 1110 | 0001 | 1011 | 0100 | 0100 | 1011 | 0001 | 1010 | 0100 | 1011 |
| S13 | 0100 | 0001 | 0001 | 0010 | 1010 | 1101 | 1001 | 0011 | 0101 | 1111 |
| S14 | 1100 | 0011 | 0011 | 0001 | 0101 | 1011 | 0111 | 0010 | 1111 | 1010 |
| S15 | 0010 | 0101 | 0101 | 1010 | 1001 | 0100 | 0110 | 1111 | 0111 | 1110 |
| S16 | 0001 | 1111 | 1111 | 0101 | 0111 | 1100 | 1101 | 1010 | 1110 | 1001 |

FIG. 3C

SYNDROME GEN MATRIX (BITS 121 THROUGH 148)

| SYMBOL ID | 31 | 32 | 33 | 34 | 35 | 36 | 37 |
|---|---|---|---|---|---|---|---|
| BIT ID | 1111 2222 1234 | 1111 2222 5678 | 1111 2333 9012 | 1111 3333 3456 | 1111 3334 7890 | 1111 4444 1234 | 1111 4444 5678 |
| S1  | 1000 | 100  | 1000 | 1000 | 1000 | 1000 | 1000 |
| S2  | 0100 | 0100 | 0100 | 0100 | 0100 | 0100 | 0100 |
| S3  | 0010 | 0010 | 0010 | 0010 | 0010 | 0010 | 0010 |
| S4  | 0001 | 0001 | 0001 | 0001 | 0001 | 0001 | 0001 |
| S5  | 1010 | 0011 | 0000 | 0000 | 0010 | 0100 | 1010 |
| S6  | 0101 | 0010 | 0000 | 0000 | 0001 | 1100 | 0101 |
| S7  | 1001 | 1111 | 0000 | 0000 | 1010 | 0010 | 1001 |
| S8  | 0111 | 1010 | 0000 | 0000 | 0101 | 0001 | 0111 |
| S9  | 0001 | 1110 | 0110 | 1000 | 0001 | 0101 | 1010 |
| S10 | 0011 | 1001 | 1101 | 0100 | 0011 | 1111 | 0101 |
| S11 | 1010 | 1101 | 1100 | 0001 | 1010 | 1001 | 1110 |
| S12 | 0101 | 1011 | 1000 | 0011 | 0101 | 0111 | 1001 |
| S13 | 1010 | 0110 | 1101 | 0010 | 0011 | 1110 | 1110 |
| S14 | 0101 | 1101 | 1011 | 0001 | 0010 | 1001 | 1001 |
| S15 | 1001 | 1000 | 0100 | 1010 | 1111 | 1011 | 1011 |
| S16 | 0111 | 0100 | 1100 | 0101 | 1010 | 0110 | 0110 |

DECIMAL REPRESENTATION OF H(i) - LAST 12 ROWS OF SYNDROME GEN MATRIX

| SYMBOL ID | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| S5  | 4  | 12 | 0 | 4  | 2  | 4  | 10 | 7  | 3  | 0  | 0  | 12 | 11 | 10 | 3  |
| S6  | 12 | 8  | 0 | 12 | 1  | 12 | 5  | 14 | 2  | 0  | 0  | 8  | 6  | 5  | 2  |
| S7  | 2  | 1  | 0 | 2  | 10 | 2  | 9  | 13 | 15 | 0  | 0  | 1  | 12 | 9  | 15 |
| S8  | 1  | 3  | 0 | 1  | 5  | 1  | 7  | 11 | 10 | 0  | 0  | 3  | 8  | 7  | 10 |
| S9  | 3  | 10 | 0 | 0  | 0  | 6  | 11 | 1  | 9  | 10 | 3  | 8  | 8  | 0  | 1  |
| S10 | 2  | 5  | 0 | 0  | 0  | 13 | 6  | 3  | 7  | 5  | 2  | 4  | 4  | 0  | 3  |
| S11 | 5  | 14 | 0 | 0  | 0  | 12 | 4  | 10 | 11 | 14 | 5  | 1  | 1  | 0  | 10 |
| S12 | 15 | 9  | 0 | 0  | 0  | 8  | 12 | 5  | 6  | 9  | 15 | 3  | 3  | 0  | 5  |
| S13 | 7  | 10 | 0 | 4  | 10 | 13 | 2  | 14 | 8  | 12 | 9  | 11 | 7  | 6  | 5  |
| S14 | 14 | 5  | 0 | 12 | 5  | 11 | 1  | 9  | 4  | .8 | 7  | 6. | 14 | 13 | 15 |
| S15 | 13 | 9  | 0 | 2  | 9  | 4  | 10 | 11 | 3  | 1  | 6  | 12 | 13 | 8  | 7  |
| S16 | 11 | 7  | 0 | 1  | 7  | 12 | 5  | 6  | 2  | 3  | 13 | 8  | 11 | 4  | 14 |

| SYMBOL ID | 16 | 17 | 18 | 19 | 20 | 21 | 22 | 23 | 24 | 25 | 26 | 27 | 28 | 29 | 30 |
|---|---|---|---|---|---|---|---|---|---|---|---|---|---|---|---|
| S5  | 3  | 11 | 7  | 2  | 2  | 11 | 3  | 11 | 9  | 1  | 2  | 9  | 7  | 6  | 6  |
| S6  | 2  | 6  | 14 | 1  | 1  | 6  | 2  | 6  | 7  | 3  | 1  | 7  | 14 | 13 | 13 |
| S7  | 15 | 12 | 13 | 10 | 10 | 12 | 15 | 12 | 6  | 5  | 10 | 6  | 13 | 8  | 8  |
| S8  | 10 | 8  | 11 | 5  | 5  | 8  | 10 | 8  | 13 | 15 | 5  | 13 | 11 | 4  | 4  |
| S9  | 8  | 9  | 12 | 13 | 0  | 15 | 12 | 14 | 13 | 13 | 14 | 12 | 2  | 13 | 14 |
| S10 | 4  | 7  | 8  | 11 | 5  | 10 | 8  | 9  | 11 | 11 | 9  | 8  | 1  | 11 | 9  |
| S11 | 1  | 11 | 2  | 8  | 14 | 7  | 2  | 13 | 8  | 8  | 13 | 2  | 15 | 8  | 13 |
| S12 | 3  | 6  | 1  | 4  | 9  | 14 | 1  | 11 | 4  | 4  | 11 | 1  | 10 | 4  | 11 |
| S13 | 8  | 2  | 6  | 13 | 11 | 4  | 1  | 1  | 2  | 10 | 13 | 9  | 3  | 5  | 15 |
| S14 | 4  | 1  | 13 | 11 | 6  | 12 | 3  | 3  | 1  | 5  | 11 | 7  | 2  | 15 | 10 |
| S15 | 3  | 10 | 8  | 4  | 12 | 2  | 5  | 5  | 10 | 9  | 4  | 6  | 15 | 7  | 14 |
| S16 | 2  | 5  | 4  | 12 | 8  | 1  | 15 | 15 | 5  | 7  | 12 | 13 | 10 | 14 | 9  |

| SYMBOL ID | 31 | 32 | 33 | 34 | 35 | 36 | 37 |
|---|---|---|---|---|---|---|---|
| S5  | 10 | 3  | 0  | 0  | 2  | 4  | 10 |
| S6  | 5  | 2  | 0  | 0  | 1  | 12 | 5  |
| S7  | 9  | 15 | 0  | 0  | 10 | 2  | 9  |
| S8  | 7  | 10 | 0  | 0  | 5  | 1  | 7  |
| S9  | 1  | 14 | 6  | 8  | 1  | 5  | 10 |
| S10 | 3  | 9  | 13 | 4  | 3  | 15 | 5  |
| S11 | 10 | 13 | 12 | 1  | 10 | 9  | 14 |
| S12 | 5  | 11 | 8  | 3  | 5  | 7  | 9  |
| S13 | 10 | 6  | 13 | 2  | 3  | 14 | 14 |
| S14 | 5  | 13 | 11 | 1  | 2  | 9  | 9  |
| S15 | 9  | 8  | 4  | 10 | 15 | 11 | 11 |
| S16 | 7  | 4  | 12 | 5  | 10 | 6  | 6  |

FIG. 7

DUAL FUNCTIONING SYMBOL ERROR CORRECTION CODE

FIELD OF THE INVENTION

The present invention relates to error correcting codes, and, more particularly to a single error correcting code that incorporates two codes into one.

BACKGROUND OF THE INVENTION

Error correcting codes (ECC) have been routinely used for fault tolerance in computer memory subsystems. The most commonly used codes are the single error correcting (SEC)-double error detecting (DED) codes capable of correcting all single errors and detecting all double errors in a code word. These SEC-DED codes are most effective in protecting memory data when the memory array chips are configured in one-bit-per-chip with respect to the ECC words. When memory chips are configured in b-bits-per-chip, a failing chip may generate from 0 to b bits of a data block, depending on the failure modes of the chip and the stored data. A b-bit error pattern generated from a chip failure is called a "symbol error." An SEC-DED code is not capable of correcting or detecting symbol ECC, error correcting codes designed for detecting and correcting symbol errors, would be more effective in providing fault tolerance for b-bits-per-chip memory applications.

As the trend of chip manufacturing is toward a larger chip capacity, more and more memory subsystems will be configured in b-bits-per-chip. The most appropriate symbol ECC to use on the memory are the single symbol error correcting (SSC) and double symbol error detecting (DSD) codes that correct all single symbol errors and detect all double symbol errors in a code word. A memory designed with an SSC-DSD code can continue to function when a memory chip fails, regardless of its failure mode. When there are two failing chips that line up in the same ECC word sometime later, the SSC-DSD code would provide the necessary error detection and protect the data integrity for the memory.

For a memory array configured in b-bit-per-chip, the ability for an ECC to correct multi-bit errors (symbol errors) generated from single chip failures is important in the ECC design. For memory reliability and for data integrity, the class of SSC-DSD codes should be used, where a symbol error is a b-bit error pattern that can be generated from a chip failure in an b-bit-per-chip memory configuration.

Normally, two separate ECCs have to be used for two different memory configurations. For example, a (144, 132) SSC-DSD code for a two-bit-per-chip memory and a (148, 132) SSC-DSD code for a four-bit-per-chip memory.

SUMMARY OF THE INVENTION

In accordance with the present invention, a method for constructing a single ECC that incorporates two codes into one is presented. This single ECC design can be applied to a memory configured in 2-bit-per-chip or 4-bit-per-chip. A mode bit M is used to indicate one of the two memory configurations. When M is 0, the ECC functions as a (144,132) SSC-DSD code with 132 data bits and 12 check bits. When M is 1 the ECC functions as a (148,132) SSC-DSD code with 132 data bits and 16 check bits. The allocated 132 data bits may consist of 128 data bits that are actually stored in the memory and 4 other bits that are not required to be stored in the memory, e.g., parities of memory address bits. For an application where the actual number of data bits is less than the allocated 132 bits, the unused data bits can be ignored or set to zero in the ECC implementation.

BRIEF DESCRIPTION OF THE DRAWINGS

Referring now to the drawings wherein like elements are numbered alike in the several FIGURES.

DETAILED DESCRIPTION OF THE INVENTION

Generation of Check Bits

An (n, k) ECC with k data bits and r check bits, where r=n−k, is a k-dimensional subspace of an n-dimensional binary linear space. There is a set of r linear equations that all ECC words have to satisfy. These parity check equations are conventionally represented by a parity check matrix or H-matrix. Each row vector of the H-matrix represents a parity check equation. Specifically, the result of the XOR of those bits of an ECC word corresponding to the ones in a row vector of the H-matrix is always equal to 0. Mathematically, if V is a binary vector of N symbols representing an ECC word, then the product of the H-matrix and the transpose of V is an all zeroes vector, i.e., $$H \cdot V^t = 0 \bmod 2 \qquad \text{Eq. 1}$$

There can be more than one H-matrix of an (n, k) ECC as there exists more than one set of r linear equations that define the same k-subspace. In this document, two H-matrices will be used to specify the same code. An ECC GEN matrix is used to define the equations for the generation of check bits and a SYNDROME GEN matrix is used to define the equations for the generation of syndrome bits.

The error correcting capability of a code depends on the parity check matrix that defines the code. To be an SSC-DSD code, the parity check matrix must satisfy the following necessary condition:

The binary vector space generated by the 3b binary column vectors of any 3 submatrices $M_i$, $M_j$, and $M_k$, $0 \leq i, j, k \leq N-1$, and $i \neq j \neq k$, has a dimension of 3b. In other words, those 3b column vectors are linearly independent over the binary field.

To store data into the ECC memory, the check bits are generated from the data using the parity check matrix to form a code word that satisfies Eq. 1. When the data are fetched from the memory sometime later, Eq. 1 is used again to check if the fetched data is a code word. The result of the left-hand side of Eq. 1 is called the syndrome. If the syndrome is not an all zeroes vector, the syndrome is decoded to determine if the errors are correctable. If the errors are correctable, the decoder determines if the i-th symbol is in error and also determines the associated symbol error pattern. A set of logic blocks would be working in parallel to determine the symbol position in error.

Referring now to FIGS. 1A–D, the ECC GEN matrix is shown in four submatrices. The top row of each submatrix shows the ID (identification) numbers for the 4-bit symbol positions. The second row indicates the bit positions. The last sixteen rows form the actual parity check matrix with 148 binary columns. Bits 1–128 and 145–148 are designated as data bits, and bits 129–144 are designated as check bits. In terms of 4-bit symbols, symbol positions 1–32 and 37 are designated as data symbols and symbol positions 33–36 are designated as check symbols. The matrix defines a (148, 132) SSC-DSD code for 4 bits per symbol. If the value of the mode bit M is 0 for 2-bit-per-chip memory configuration, bits 141–144 (symbol 36) will not be stored in the memory. In this case, the ECC becomes a (144,132) SSC-DSD code for 2 bits per chip memory. For a 2-bit-per-chip memory, each 4-bit symbol is split into two halves and stored in two different array chips.

Figure 1A:
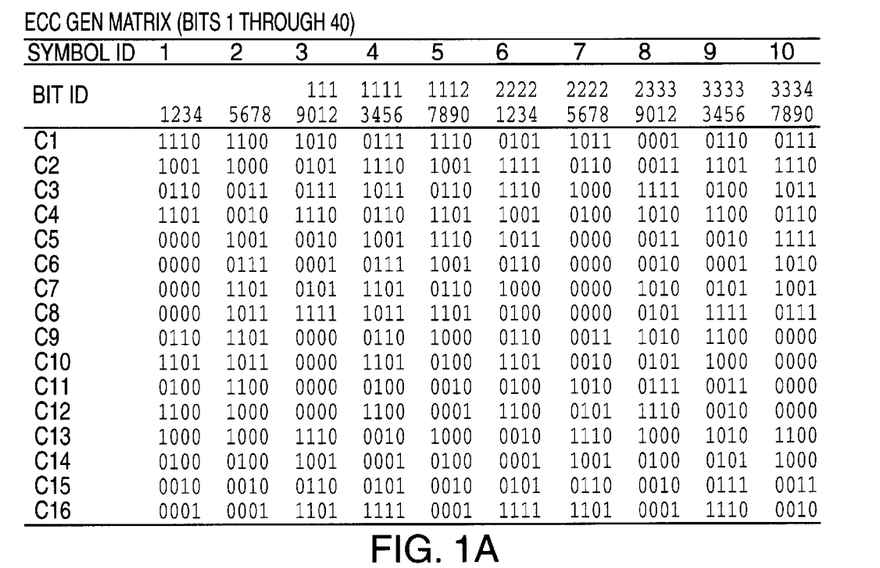
FIGS. 1A–D are an error correction code generating matrix, ECC GEN, for generating the check bits in accordance with the present invention.
Figure 1B:
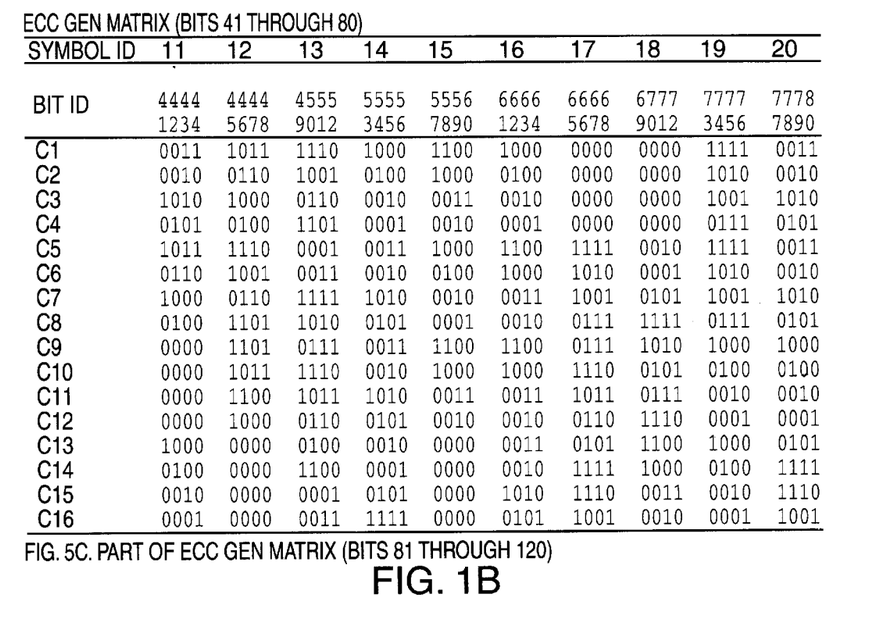
Figure 1C:
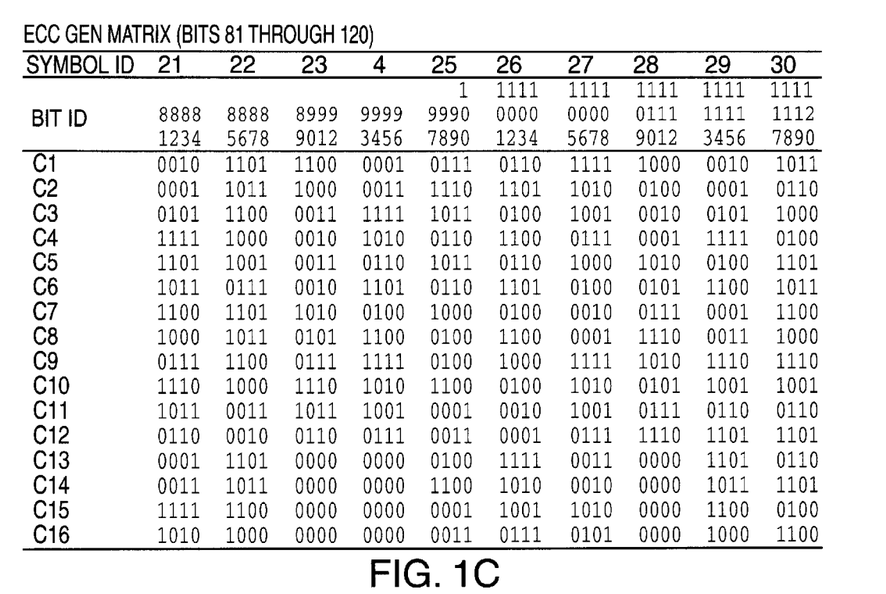
Figure 1D:
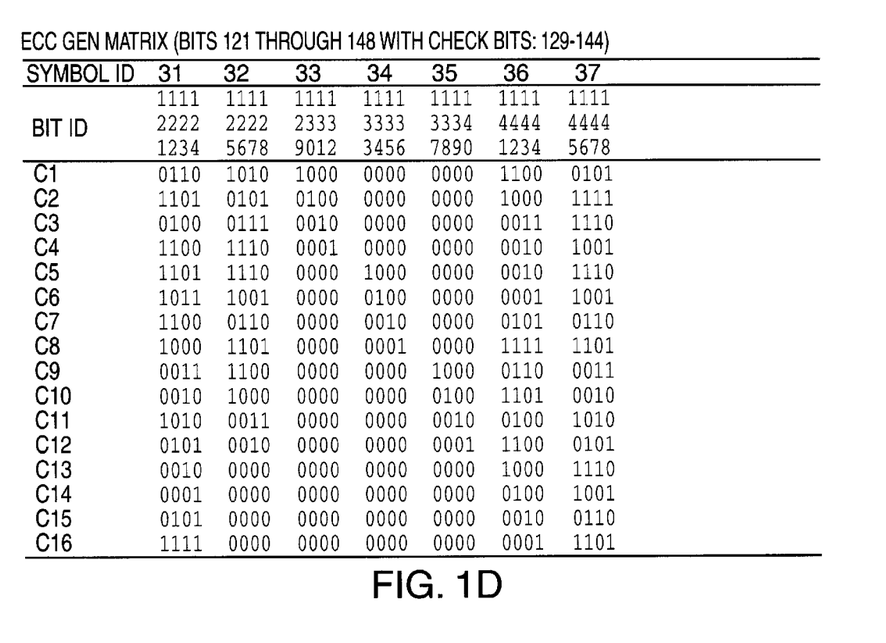
Figure 2:
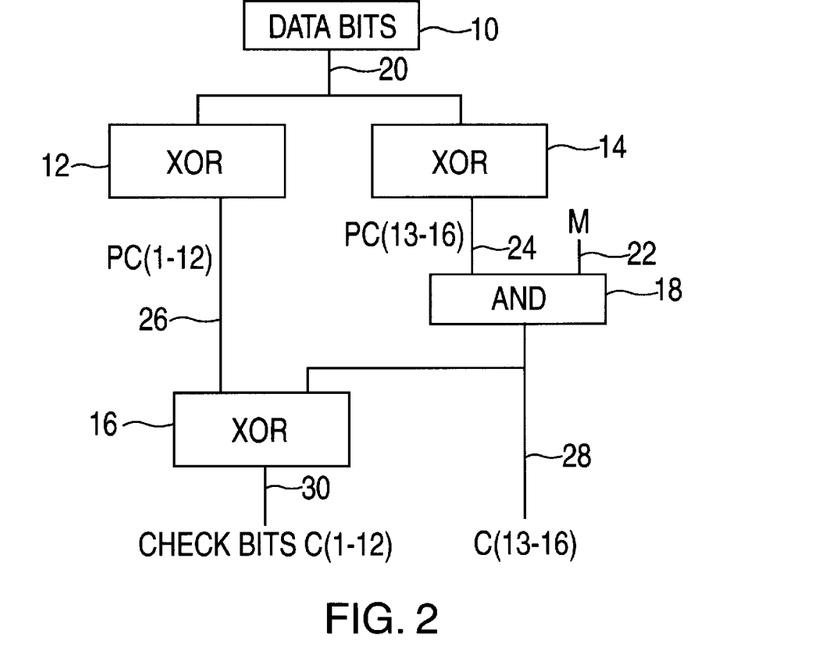
FIG. 2 is a functional block diagram for generating the check bits of the parity check matrix of the present invention.

Since an ECC word has to satisfy Eq. 1, the XOR of those bits of the ECC word at positions marked by the ones in a row of the ECC GEN matrix should be zero. Techniques for constructing such a matrix are known (e.g., W. W. Peterson arid E. J. Weldon, Jr., *Error Correcting Codes,* second edition, Cambridge, Mass.: MIT Press, 1972, which is incorporated by reference). This relation allows calculation of the values of check bits from the given values of data bits. From the ECC matrix, the XOR functions of TABLES 1 and 2 below is derived. The check bits are generated from logical operations (checkbit generator) as shown in FIG. 2. Data bits 10 are connected via a line 20 to XOR functions 12 and 14. First partial check bits PC(1–12) on a line 26 and partial check bits PC(13–16) on a line 24 are generated from the two separate XOR functions, XOR 12 and XOR 14 described as shown in TABLES 1 and 2, respectively. AND gate 18 is configured to receive partial check bits PC(13–16) 24 and mode bit, M, on a line 22 wherein are the result of the AND operation output check bits C(13–16) on a line 28. That is, if M=1, check bits C(13–16) are the same as partial check bits PC(13–16); otherwise, if M=0, check bits C(13–16) are zeroes. If M=0, check bits C(13–16) are not stored in the memory. Check bits C(1–12) on a line 30 are obtained from a TABLE 3, below, XOR function 16 arranged to receive the partial check bits PC(1–12) on line 26 and check bits C(13–16) on line 28.

TABLE 1

(XOR 12 function)

PC(1) = XOR of data bits

| 1 | 2 | 3 | 5 | 6 | 9 | 11 | 14 | 15 | 16 | 17 | 18 | 19 | 22 |
|---|---|---|---|---|---|---|---|---|---|---|---|---|---|
| 24 | 25 | 27 | 28 | 32 | 34 | 35 | 38 | 39 | 40 | 43 | 44 | 45 | 47 |
| 48 | 49 | 103 | 105 | 106 | 50 | 51 | 53 | 57 | 58 | 61 | 73 | 74 | 75 |
| 76 | 79 | 80 | 83 | 85 | 86 | 88 | 89 | 90 | 96 | 98 | 99 | 100 | 102 |
| 107 | 108 | 109 | 115 | 117 | 119 | 120 | 122 | 123 | 125 | 127 | 146 | 148 | |

PC(2) = XOR of data bits

| 1 | 4 | 5 | 10 | 12 | 13 | 14 | 15 | 17 | 20 | 21 | 22 | 23 |
|---|---|---|---|---|---|---|---|---|---|---|---|---|
| 24 | 26 | 27 | 31 | 32 | 33 | 34 | 36 | 37 | 38 | 39 | 43 | 46 |
| 47 | 49 | 52 | 54 | 57 | 62 | 73 | 75 | 79 | 84 | 85 | 87 | 88 |
| 89 | 95 | 96 | 97 | 98 | 99 | 101 | 102 | 104 | 105 | 107 | 110 | |
| 116 | 118 | 119 | 121 | 122 | 124 | 126 | 128 | 145 | 146 | 147 | 148 | |

PC(3) = XOR of data bits

| 2 | 3 | 7 | 8 | 10 | 11 | 12 | 13 | 15 | 16 | 18 | 19 | 21 |
|---|---|---|---|---|---|---|---|---|---|---|---|---|
| 22 | 23 | 25 | 29 | 30 | 31 | 32 | 34 | 37 | 39 | 40 | 41 | 43 |
| 45 | 50 | 51 | 55 | 59 | 60 | 63 | 73 | 76 | 77 | 79 | 82 | 84 |
| 85 | 86 | 91 | 92 | 93 | 94 | 95 | 96 | 97 | 99 | 100 | 102 | 105 |
| 108 | 111 | 114 | 116 | 117 | 122 | 126 | 127 | 128 | 145 | 146 | 147 | |

PC(4) = XOR of data bits

| 1 | 2 | 4 | 7 | 9 | 10 | 11 | 14 | 15 | 17 | 18 | 20 | 21 |
|---|---|---|---|---|---|---|---|---|---|---|---|---|
| 24 | 26 | 29 | 31 | 33 | 34 | 38 | 39 | 42 | 44 | 46 | 49 | 50 |
| 52 | 56 | 59 | 64 | 74 | 75 | 76 | 78 | 80 | 81 | 82 | 83 | 84 |
| 85 | 91 | 93 | 95 | 98 | 99 | 101 | 102 | 106 | 107 | 108 | 112 | |
| 113 | 114 | 115 | 116 | 118 | 121 | 122 | 125 | 126 | 127 | 145 | 148 | |

PC(5) = XOR of data bits

| 5 | 8 | 11 | 13 | 16 | 17 | 18 | 19 | 21 | 23 | 24 | 31 | 32 | 71 | 73 |
|---|---|---|---|---|---|---|---|---|---|---|---|---|---|---|
| 35 | 37 | 38 | 39 | 40 | 41 | 43 | 44 | 45 | 46 | 47 | 99 | 52 | 55 | |
| 56 | 79 | 80 | 57 | 61 | 62 | 65 | 66 | 67 | 68 | 74 | 75 | 76 | 81 | |
| 82 | 84 | 85 | 88 | 91 | 92 | 94 | 95 | 97 | 100 | 102 | 103 | 105 | 109 | |
| 111 | 114 | 117 | 118 | 120 | 121 | 122 | 124 | 125 | 126 | 127 | 145 | 146 | 147 | |

TABLE 1-continued

(XOR 12 function)

PC(6) = XOR of data bits

| | | | | | | | | | | | |
|---|---|---|---|---|---|---|---|---|---|---|---|
| 6   | 7   | 8   | 12  | 14  | 15  | 16  | 17  | 20  | 22  | 23  | 31  |
| 36  | 37  | 39  | 42  | 43  | 45  | 48  | 51  | 52  | 55  | 58  | 61  |
| 65  | 67  | 72  | 73  | 75  | 79  | 81  | 83  | 84  | 86  | 87  | 88  |
| 91  | 93  | 94  | 96  | 98  | 99  | 101 | 102 | 104 | 106 | 110 | 112 |
| 113 | 114 | 117 | 119 | 120 | 121 | 123 | 124 | 125 | 128 | 145 | 148 |

PC(7) = XOR of data bits

| | | | | | | | | | | | |
|---|---|---|---|---|---|---|---|---|---|---|---|
| 5   | 6   | 8   | 10  | 12  | 13  | 14  | 16  | 18  | 19  | 21  | 29  |
| 31  | 34  | 36  | 37  | 40  | 41  | 46  | 47  | 49  | 50  | 51  | 52  |
| 53  | 55  | 59  | 63  | 64  | 65  | 68  | 70  | 72  | 73  | 76  | 77  |
| 79  | 81  | 82  | 85  | 86  | 88  | 89  | 91  | 94  | 97  | 102 | 107 |
| 110 | 111 | 112 | 116 | 117 | 118 | 121 | 122 | 126 | 127 | 146 | 147 |

PC(8) = XOR of data bits

| | | | | | | | | | | | |
|---|---|---|---|---|---|---|---|---|---|---|---|
| 5   | 7   | 8   | 9   | 10  | 11  | 12  | 13  | 15  | 16  | 17  | 18  | 20  | 22  |
| 30  | 32  | 33  | 34  | 35  | 36  | 38  | 39  | 40  | 42  | 45  | 46  | 48  | 49  |
| 51  | 54  | 56  | 60  | 63  | 66  | 67  | 68  | 69  | 70  | 71  | 72  | 74  | 75  |
| 76  | 78  | 80  | 81  | 85  | 87  | 88  | 90  | 92  | 93  | 94  | 98  | 101 | 102 |
| 108 | 109 | 110 | 111 | 115 | 116 | 117 | 121 | 125 | 126 | 128 | 145 | 146 | 148 |

PC(9) = XOR of data bits

| | | | | | | | | | | | |
|---|---|---|---|---|---|---|---|---|---|---|---|
| 2   | 3   | 5   | 6   | 8   | 14  | 15  | 17  | 22  | 23  | 27  | 28  | 29  | 31  |
| 33  | 34  | 45  | 46  | 48  | 50  | 51  | 52  | 55  | 56  | 57  | 58  | 61  | 62  |
| 66  | 67  | 68  | 69  | 71  | 73  | 77  | 82  | 83  | 84  | 85  | 86  | 90  |     |
| 91  | 92  | 93  | 94  | 95  | 96  | 98  | 101 | 105 | 106 | 107 | 108 | 109 |     |
| 111 | 113 | 114 | 115 | 117 | 118 | 119 | 123 | 124 | 125 | 126 | 147 | 148 |     |

PC(10) = XOR of data bits

| | | | | | | | | | | | |
|---|---|---|---|---|---|---|---|---|---|---|---|
| 1   | 2   | 4   | 5   | 7   | 8   | 13  | 14  | 16  | 18  | 21  | 22  | 24  | 27  |
| 30  | 32  | 33  | 45  | 47  | 48  | 49  | 50  | 51  | 55  | 57  | 61  | 65  | 66  |
| 67  | 70  | 72  | 74  | 78  | 81  | 82  | 83  | 85  | 89  | 90  | 91  | 93  | 95  |
| 97  | 98  | 102 | 105 | 107 | 110 | 112 | 113 | 116 | 117 | 120 | 123 | 125 | 147 |

PC(11) = XOR of data bits

| | | | | | | | | | | | |
|---|---|---|---|---|---|---|---|---|---|---|---|
| 2   | 5   | 6   | 14  | 19  | 22  | 25  | 27  | 30  | 31  | 32  | 35  | 36  | 45  | 46  |
| 49  | 51  | 52  | 53  | 55  | 59  | 60  | 63  | 64  | 65  | 67  | 68  | 70  | 71  | 72  |
| 75  | 79  | 81  | 83  | 84  | 87  | 88  | 89  | 91  | 92  | 93  | 96  | 100 | 103 | 105 |
| 108 | 110 | 111 | 112 | 114 | 115 | 118 | 119 | 121 | 123 | 127 | 128 | 145 | 147 |     |

PC(12) = XOR of data bits

| | | | | | | | | | | | |
|---|---|---|---|---|---|---|---|---|---|---|---|
| 1   | 2   | 5   | 13  | 14  | 20  | 21  | 22  | 26  | 28  | 29  | 30  | 31  | 35  |
| 45  | 50  | 51  | 56  | 59  | 63  | 66  | 67  | 69  | 70  | 71  | 76  | 80  | 82  |
| 83  | 87  | 90  | 91  | 94  | 95  | 96  | 99  | 100 | 104 | 106 | 107 | 108 | 109 |
| 110 | 111 | 113 | 114 | 116 | 117 | 118 | 120 | 122 | 124 | 127 | 146 | 148 |     |

TABLE 2

PC(13) = XOR of data bits

| | | | | | | | | | | | |
|---|---|---|---|---|---|---|---|---|---|---|---|
| 1   | 5   | 9   | 10  | 11  | 15  | 17  | 23  | 25  | 26  | 27  | 29  |
| 33  | 35  | 37  | 38  | 41  | 50  | 55  | 63  | 64  | 66  | 68  | 69  |
| 70  | 73  | 78  | 80  | 84  | 85  | 86  | 88  | 98  | 101 | 102 | 103 |
| 104 | 107 | 108 | 113 | 114 | 116 | 118 | 119 | 123 | 145 | 146 | 147 |

PC(14) = XOR of data bits

| | | | | | | | | | | | |
|---|---|---|---|---|---|---|---|---|---|---|---|
| 2   | 6   | 9   | 12  | 16  | 18  | 24  | 25  | 28  | 30  | 34  | 36  |
| 37  | 42  | 49  | 50  | 56  | 63  | 65  | 66  | 67  | 68  | 69  | 74  |
| 77  | 78  | 79  | 80  | 83  | 84  | 85  | 87  | 88  | 97  | 98  | 101 |
| 103 | 107 | 113 | 115 | 116 | 117 | 118 | 120 | 124 | 145 | 148 |     |

TABLE 2-continued

PC(15) = XOR of data bits

| 3 | 7 | 10 | 11 | 14 | 16 | 19 | 22 | 24 | 26 | 27 | 31 | 34 |
|---|---|---|---|---|---|---|---|---|---|---|---|---|
| 35 | 36 | 39 | 40 | 43 | 52 | 54 | 56 | 61 | 63 | 65 | 66 | 67 |
| 71 | 72 | 75 | 77 | 78 | 79 | 81 | 82 | 83 | 84 | 85 | 86 | |

PC(16) = XOR of data bits

| 4 | 8 | 9 | 10 | 12 | 13 | 14 | 15 | 16 | 20 | 21 | 22 | 23 | 24 | 25 |
|---|---|---|---|---|---|---|---|---|---|---|---|---|---|---|
| 26 | 28 | 32 | 33 | 34 | 35 | 39 | 44 | 51 | 52 | 53 | 54 | 55 | 56 | |
| 62 | 64 | 65 | 68 | 71 | 76 | 77 | 80 | 81 | 83 | 85 | 99 | 100 | 102 | |
| 103 | 104 | 106 | 108 | 113 | 117 | 118 | 121 | 122 | 123 | 124 | 145 | 146 | 148 | |

TABLE 3

(XOR 16 function)

C(1) = XOR of (PC(1), PC(13, 14) AND M)
C(2) = XOR of (PC(2), PC(13) AND M)
C(3) = XOR of (PC(3), PC(15, 16) AND M)
C(4) = XOR of (PC(4), PC(15) AND M)
C(5) = XOR of (PC(5), PC(15) AND M)
C(6) = XOR of (PC(6), PC(16) AND M)
C(7) = XOR of (PC(7), PC(14, 16) AND M)
C(8) = XOR of (PC(8), PC(13, 14, 15, 16) AND M)
C(9) = XOR of (PC(9), PC(14, 15) AND M)
C(10) = XOR of (PC(10), PC(13, 14, 16) AND M)
C(11) = XOR of (PC(11), PC(14) AND M)
C(12) = XOR of (PC(12), PC(13, 14) AND M)

If the number of data bits in an application is less than 132, the unused data bits can be removed from XOR 12 and XOR 14 functions.

Generation of Syndrome Bits

When an ECC encoded word W is received, it is checked to see if the syndrome $S = H \cdot W^t$ is an all zeroes vector. If S is an all zeroes vector, it is assumed that there is no error in W. Otherwise, S is decoded to determine if the errors in W is correctable and to determine the locations of the errors.

The ECC GEN matrix (FIGS. 1A–D) can be used to generate syndrome bits. However, for speed of error correction, a separate SYNDROME GEN matrix as shown in FIGS. 3A–D is used. The row vectors of the ECC GEN matrix and those of the SYNDROME GEN matrix generate the same vector space, and thus, define the same code.

Figure 3A:
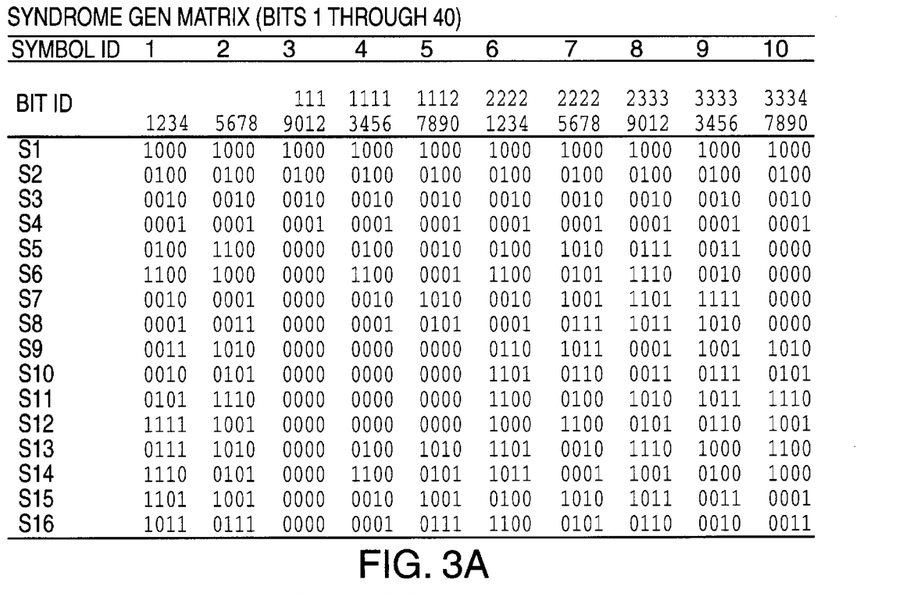
FIGS. 3A–D are the syndrome generating matrix, SYNDROME GEN, for generating the syndrome bits in accordance with the present invention.
Figure 3B:
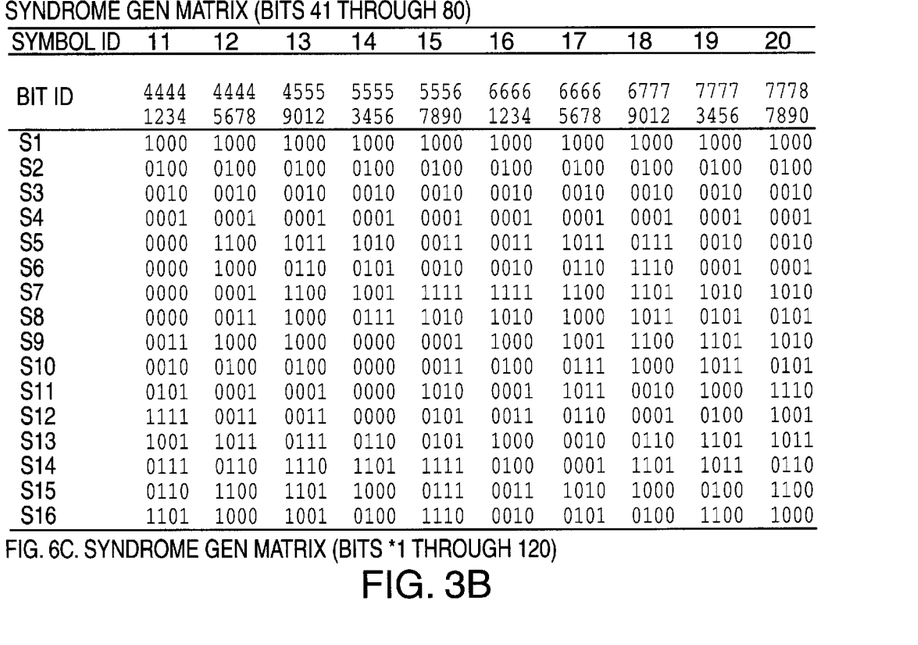
Figure 3C:
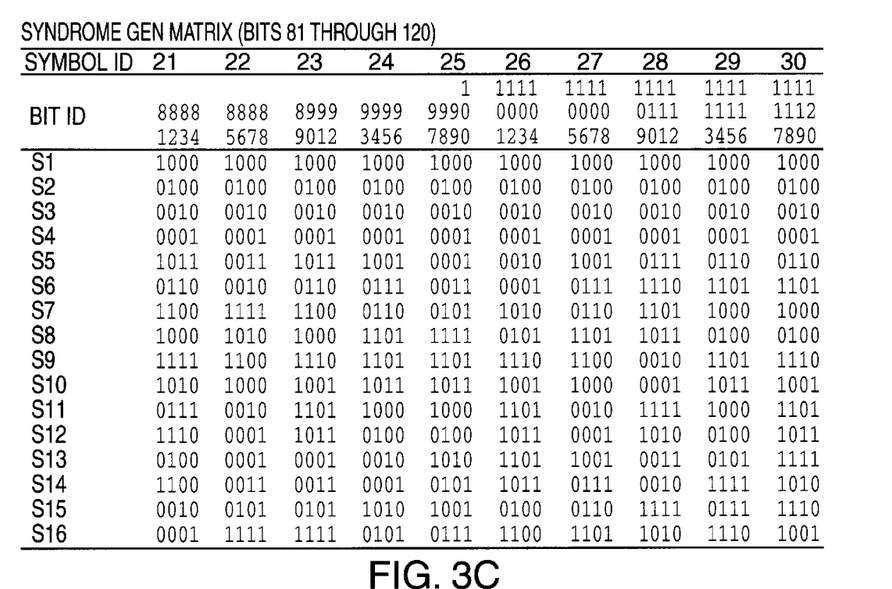
Figure 3D:
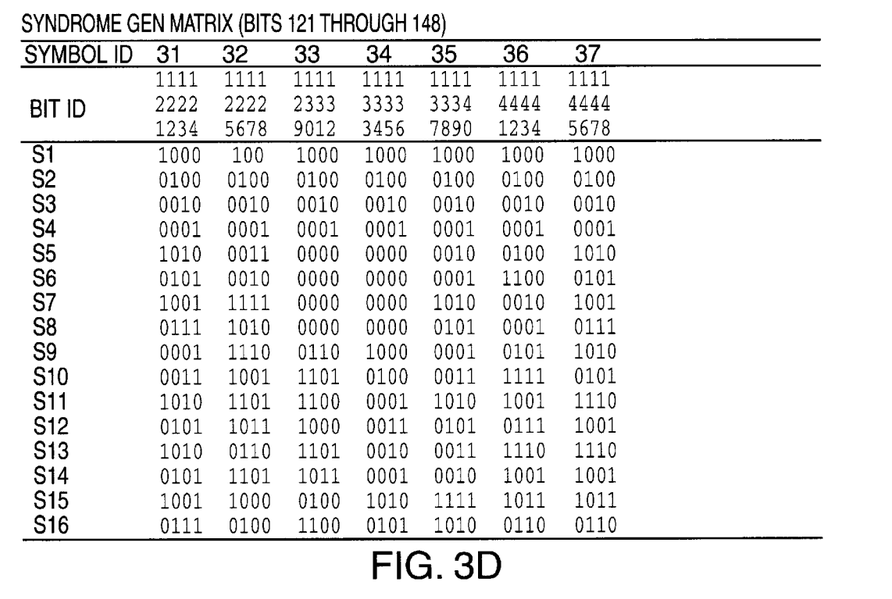
Figure 4:
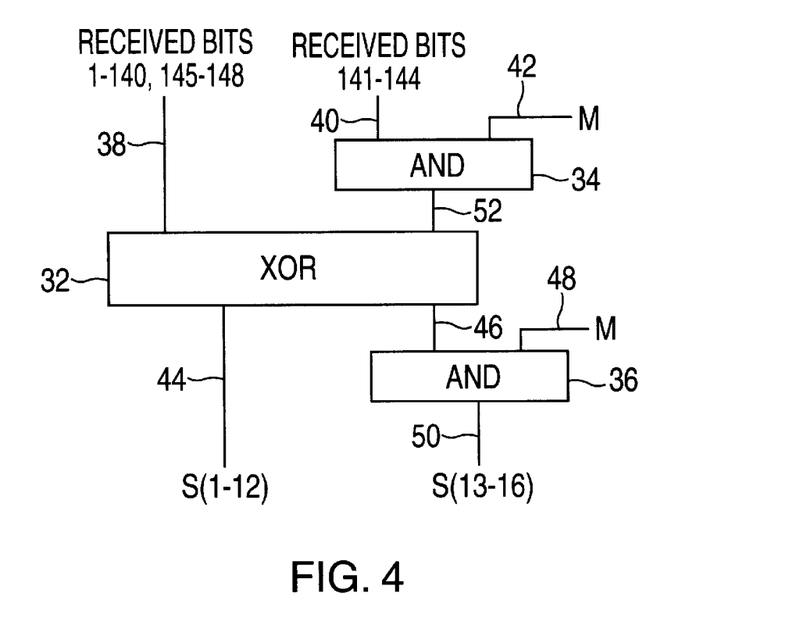
FIG. 4 is a functional block diagram for the generation of syndrome bits of the present invention.

Referring to FIG. 4 a block diagram for the generation of syndrome bits (syndrome generator) is shown. If M=1, all received bits participate in the generation of syndrome bits through the XOR 16 function. Note that the received bits include those that participated in the check bit generation but did not get stored in the memory (e.g., parities of address bits). If M=0, received bits 141–144 on a line 40 are preset to zero by the operation of an AND gate 34 with M on a line 42 before they enter XOR 32 function arranged to receive bits 141–144 on a line 52. In addition, AND gate 36 receives the output of XOR gate 32 on a line 46 and operates with M on a line 48 to set output bits S(13–16) to zeroes on a line 50. Referring also to the SYNDROME GEN (FIGS. 3A–D), syndrome bits S(i) is generated by the XOR of the received bits marked by the ones at the i-th row of the matrix. The XOR 32 is an implementation of the XOR operations defined by the SYNDROME GEN matrix. Received bits 1–140, 145–148 are connected to XOR 32 by a line 38 and received bits 141–144 are connected to XOR 32 by line 52 after processing with M as herein above described. Each of the 16 output bits are generated by implementation of the equations of TABLE 4, XOR 32 function:

TABLE 4

(XOR 32 function)

Output bit 1 = XOR of input bits
1, 5, 9, 13, 17, 21, 25, 29, 33, 37, 41, 45, 49, 53, 57, 61, 65, 69, 73, 77, 81, 85, 89, 93, 97, 101, 105, 109, 113, 117, 121, 125, 129, 133, 137, 141, 145.
Output bit 2 = XOR of input bits
2, 6, 10, 14, 18, 22, 26, 30, 34, 38, 42, 46, 50, 54, 58, 62, 66, 70, 74, 78, 82, 86, 90, 94, 98, 102, 106, 110, 114, 118, 122, 126, 130, 134, 138, 142, 146.
Output bit 3 = XOR of input bits
3, 7, 11, 15, 19, 23, 27, 31, 35, 39, 43, 47, 51, 55, 59, 63, 67, 71, 75, 79, 83, 87, 91, 95, 99, 103, 107, 111, 115, 119, 123, 127, 131, 135, 139, 143, 147.
Output bit 4 = XOR of input bits
4, 8, 12, 16, 20, 24, 28, 32, 36, 40, 44, 48, 52, 56, 60, 64, 68, 72, 76, 80, 84, 88, 92, 96, 100, 104, 108, 112, 116, 120, 124, 128, 132, 136, 140, 144, 148.
Output bit 5 = XOR of input bits
2, 5, 6, 14, 19, 22, 25, 27, 30, 31, 32, 35, 36, 45, 46, 49, 51, 52, 53, 55, 59, 60, 63, 64, 65, 67, 68, 70, 71, 72, 75, 79, 81, 83, 84, 87, 88, 89, 91, 92, 93, 96, 100, 103, 105, 108, 110, 111, 112, 114, 115, 118, 119, 121, 123, 127, 128, 139, 142, 145, 147.
Output bit 6 = XOR of input bits
1, 2, 5, 13, 14, 20, 21, 22, 26, 28, 29, 30, 31, 35, 45, 50, 51, 54, 56, 59, 63, 66, 67, 69, 70, 71, 76, 80, 82, 83, 87, 90, 91, 94, 95, 96, 99, 100, 104, 106, 107, 108, 109, 110, 111, 113, 114, 116, 117, 118, 120, 122, 124, 127, 140, 141, 142, 146, 148.
Output bit 7 = XOR of input bits
3, 8, 15, 17, 19, 23, 25, 28, 29, 30, 32, 33, 34, 35, 36, 48, 49, 50, 53, 56, 57, 58, 59, 60, 61, 62, 63, 64, 65, 66, 69, 70, 72, 73, 75, 77, 79, 81, 82, 85, 86, 87, 88, 89, 90, 94, 95, 98, 100, 101, 103, 106, 107, 109, 110, 112, 113, 117, 121, 124, 125, 126, 127, 128, 137, 139, 143, 145, 148.

TABLE 4-continued (XOR 32 function)

Output bit 8 = XOR of input bits
4, 7, 8, 16, 18, 20, 24, 26, 27, 28, 29, 31, 32, 33, 35, 47, 48, 49, 54, 55, 56, 57, 59, 61, 63, 65, 69, 71, 72, 74, 76, 78, 80, 81, 85, 87, 89, 93, 94, 96, 97, 98, 99, 100, 102, 104, 105, 106, 108, 109, 111, 112, 114, 118, 122, 123, 124, 125, 127, 138, 140, 144, 146, 147, 148.

Output bit 9 = XOR of input bits
3, 4, 5, 7, 22, 23, 25, 27, 28, 32, 33, 36, 37, 39, 43, 44, 45, 49, 60, 61, 65, 68, 69, 70, 73, 74, 76, 77, 79, 81, 82, 83, 84, 85, 86, 89, 90, 91, 93, 94, 96, 97, 98, 100, 101, 102, 103, 105, 106, 111, 113, 114, 116, 117, 118, 119, 124, 125, 126, 127, 130, 131, 133, 140, 142, 144, 145, 147.

Output bit 10 = XOR of input bits
3, 6, 8, 21, 22, 24, 26, 27, 31, 32, 34, 35, 36, 38, 40, 43, 46, 50, 59, 60, 62, 66, 67, 68, 69, 73, 75, 76, 78, 80, 81, 83, 85, 89, 92, 93, 95, 96, 97, 99, 100, 101, 104, 105, 112, 113, 115, 116, 117, 120, 123, 124, 125, 128, 129, 130, 132, 134, 139, 140, 141, 142, 143, 144, 146, 148.

Output bit 11 = XOR of input bits
2, 4, 5, 6, 7, 21, 22, 26, 29, 31, 33, 35, 36, 37, 38, 39, 42, 44, 48, 52, 57, 59, 64, 65, 67, 68, 71, 73, 77, 78, 79, 82, 83, 84, 87, 89, 90, 92, 93, 97, 100, 102, 104, 107, 109, 110, 111, 112, 113, 117, 118, 120, 121, 123, 125, 126, 128, 129, 130, 136, 137, 139, 141, 144, 145, 146, 147.

Output bit 12 = XOR of input bits
1, 2, 3, 4, 5, 8, 21, 25, 26, 30, 32, 34, 35, 37, 40, 41, 42, 43, 44, 47, 48, 51, 52, 58, 60, 63, 64, 66, 67, 72, 74, 77, 80, 81, 82, 83, 88, 89, 91, 92, 94, 98, 101, 103, 104, 108, 109, 111, 114, 117, 119, 120, 122, 124, 125, 127, 128, 129, 135, 136, 138, 140, 142, 143, 144, 145, 148.

Output bit 13 = XOR of input bits
2, 3, 4, 5, 7, 14, 17, 19, 21, 22, 24, 27, 29, 30, 31, 33, 37, 38, 41, 44, 45, 47, 48, 50, 51, 52, 54, 55, 58, 60, 61, 67, 70, 71, 73, 74, 76, 77, 79, 80, 82, 88, 92, 95, 97, 99, 101, 102, 104, 105, 108, 111, 112, 114, 116, 117, 118, 119, 120, 121, 123, 126, 127, 129, 130, 132, 135, 139, 140, 141, 142, 143, 145, 146, 147.

Output bit 14 = XOR of input bits
1, 2, 3, 6, 8, 13, 14, 18, 20, 21, 23, 24, 28, 29, 32, 34, 37, 42, 43, 44, 46, 47, 49, 50, 51, 53, 54, 56, 57, 58, 59, 60, 62, 68, 69, 70, 72, 73, 75, 76, 78, 79, 81, 82, 87, 88, 91, 92, 96, 98, 100, 101, 103, 104, 106, 107, 108, 111, 113, 114, 115, 116, 117, 119, 122, 124, 125, 126, 128, 129, 131, 132, 136, 139, 141, 144, 145, 148.

Output bit 15 = XOR of input bits
1, 2, 4, 5, 8, 15, 17, 20, 22, 25, 27, 29, 31, 32, 35, 36, 40, 42, 43, 45, 46, 49, 50, 52, 53, 58, 59, 60, 63, 64, 65, 67, 69, 74, 77, 78, 83, 86, 88, 90, 92, 93, 95, 97, 100, 102, 106, 107, 109, 110, 111, 112, 114, 115, 116, 117, 118, 119, 121, 124, 125, 130, 133, 135, 137, 138, 139, 140, 141, 143, 144, 145, 147, 148.

Output bit 16 = XOR of input bits
1, 3, 4, 6, 7, 8, 16, 18, 19, 20, 21, 22, 26, 28, 30, 31, 35, 39, 40, 41, 42, 44, 45, 49, 51, 52, 54, 57, 58, 59, 63, 66, 68, 70, 73, 74, 77, 84, 85, 86, 87, 88, 89, 90, 91, 92, 94, 96, 98, 99, 100, 101, 102, 105, 106, 108, 109, 111, 113, 114, 115, 117, 120, 122, 123, 124, 126, 129, 130, 134, 136, 137, 139, 142, 143, 146, 147.

If the number of data bits is less than 132 in an application, the unused data bits can be removed from the XOR 32 function.

Properties of SYNDROME GEN Matrix

The ECC of the present invention provides for single symbol error correction and double symbol error detection for both 2 bits per symbol and 4 bits per symbol with 12 and 16 check bits, respectively. To achieve this, the ECC H-matrix (FIGS. 1A–D) has to possess certain properties pertaining to the error detection and error correction abilities. The H-matrix can be divided into submatrices according to the symbol size m. That is, the H-matrix is of the form:

$$H = [H_1, H_2, H_3, \ldots H_N]$$

where each $H_i$ is an m-column binary matrix and N is the number of symbols in a word. Let $E = (E_1, E_2, \ldots, E_N)$ be an error vector representing the error pattern in the received word W, where $E_1$ is an m-bit error pattern. Then W=V+E mod 2, or W=V XOR E, where V is the original valid ECC word. The syndrome S is defined as $S = H \cdot W^t$. From Eq. 1:

$$S = H \cdot W^t = H \cdot (V^t + E^t) = H \cdot E^t \qquad \text{Eq. 3}$$

$$= H_1 \cdot E^t_1 + H_2 \cdot E^t_2 + \ldots + H_N \cdot E^t_N \bmod 2 \qquad \text{Eq. 4}$$

Thus, the syndrome is independent of the original ECC word V. Furthermore, for a single symbol error at position i, the syndrome is equal to $S = H_i \cdot E_i^t$. Given a non zero syndrome S, the task of error correction is to determine first the position of the symbol error and the associated symbol error pattern, then invert the received data at the position of error according to the symbol error pattern.

To be able to correct all symbol errors, the syndromes of all single symbol errors have to be unique. Let the set of correctable syndromes be the syndromes of all single symbol errors and the zero syndrome. To be able to detect all double symbol errors, any syndrome of a double symbol error must be not the same as a member of the correctable syndromes. To meet these conditions, the H-matrix must have the following properties:

$$H_i \cdot E_i^t \neq H_j \cdot E_j^t \neq 0, \text{ for } i \neq j, \text{ and } E_i \neq 0, E_j \neq 0; \qquad \text{Eq. 5}$$

and $$H_k \cdot E_k^t \neq H_i \cdot E_i^t + H_j \cdot E_j^t, \text{ for } i \neq j \neq k, \text{ and } E_i \neq 0, E_j \neq 0, E_k \neq 0. \qquad \text{Eq. 6}$$

For the SYNDROME GEN matrix (FIGS. 3A–D), it satisfies Eqs. 5 and 6 when the matrix is grouped into 37 16×4 submatrices with a symbol size m=4. The matrix defines a (148, 132) code that is capable of correcting all single symbol errors and detecting all double symbol errors with 4 bits per symbol. In addition, let H' be the matrix taken from the first 12 rows of the SYNDROME GEN matrix. It can be shown that H' also satisfies Eqs. 5 and 6 when H' is grouped into 74 12×2 submatrices with a symbol size m=2. Thus, H' defines a (148, 136) SSC-DSD code with 2 bits per symbol. Since bits 141–144 are designated as check bits for m=4, H' with columns at bit positions 141–144 deleted defines a (144,132) SSD-DSD code with m=2. The statements above also apply to the ECC GEN matrix.

Syndrome Decoding and Error Correction

If the syndrome S=S(1–16) is zero, the received word is error free. If S is not zero, the syndrome decoder is to determine if there is a correctable symbol error and determine the symbol error position and the symbol error pattern.

Consider first M=1 for 4 bits per symbol. Let $H_i$ be the 4-column matrix of the SYNDROME GEN matrix at the i-th symbol position. A symbol error occurred at position i with an error pattern $E_i$ would result in a syndrome $S=H_i \cdot E_i^t$. Note that the first four rows of $H_i$ form a 4×4 identity matrix. The first four syndrome bits S(1–4) are identical to $E_i$. Thus, $$S = H_{i,s}(1-4)^t \qquad \text{Eq. 7}$$

The syndrome decoding is now reduced to identifying i such that Eq. 7 is satisfied for a given S.

Figure 5:
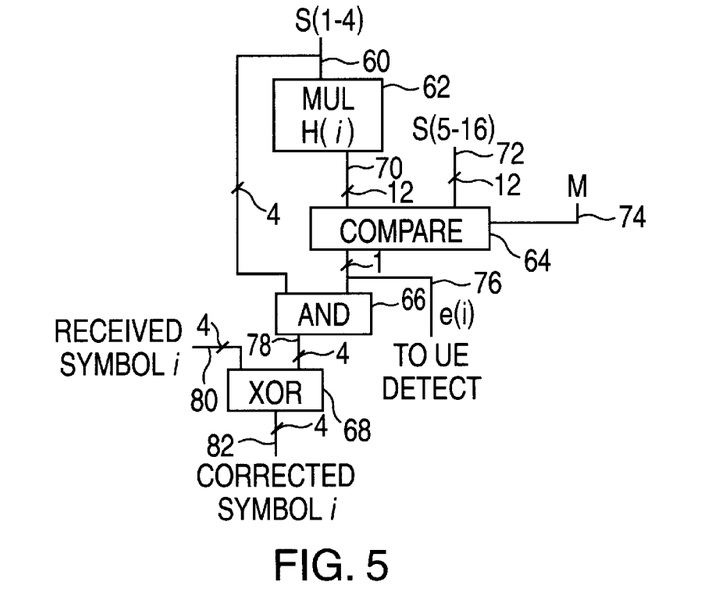
FIG. 5 is a functional block diagram for a method of solving an equation of the present invention in accordance with one embodiment thereof.

Referring now to FIG. 5, where a circuit (error correction circuit)for resolving Eq. 7 is shown. Let H(i) be the matrix $H_i$, $1 \leq i \leq 37$, with the top four rows removed. The first 4 syndrome bits S(1–4) are connected to a multiplier 62 by a line 60 and used to multiply H(i) to produce 12 bit output bits on a line 70. A compare 64 receives the 12 output bits on line 70 and syndrome bits S(5–16) on a line 72 seeking a complete match. If the comparison is a success, the symbol error indicator e(i) on a line 76 is set to 1 to indicate that symbol i is in error. In this case, the received symbol i on a line 80 is inverted by S(1–4) to obtain the corrected symbol on a line 82 by the operation of the XOR gate 68 with S(1–4) on line 60 through an AND gate 66 which passes S(1–4) through unchanged if e(i) is 1 on line 76. If the comparison is not successful, e(i) is set to 0 on line 76 and received symbol i is not inverted. The logic of FIG. 5 is replicated for all symbols to be corrected. Usually, the check symbols are not corrected. However, the symbol error indicators for check symbols still have to be generated for the purpose of detecting uncorrectable errors (UE).

The compare 64 block is gated by the mode bit M on a line 74. If M=1, the compare function is done as described herein above. If M=0, the effective bits participated in the comparison are the first 8 bits from the output of multiplier 62 and S(5–12). In this case, the last four bits in either set of the inputs of the compare 64 block are ignored.

The multiplier 62 in FIG. 3 takes 4 inputs from S(1–4) on line 60 to generate a 12-bit output. The j-th output bit is the XOR of S(1–4) masked by the j-th row of H(i). Consider i=1 for an example, the output bits are calculated according to the following:

Bit 1=S(1)
Bit 2=XOR of S(1,2)
Bit 3=S(3)
Bit 4=S(4)
Bit 5=XOR of S(3,4)
Bit 6=S(3)
Bit 7=XOR of S(2,4)
Bit 8=XOR of S(1,2,3,4)
Bit 9=XOR of S(2,3,4)
Bit 10=XOR of S(1,2,3)
Bit 11=XOR of S(1,2,4)
Bit 12=XOR of S(1,3,4).

Figure 6:
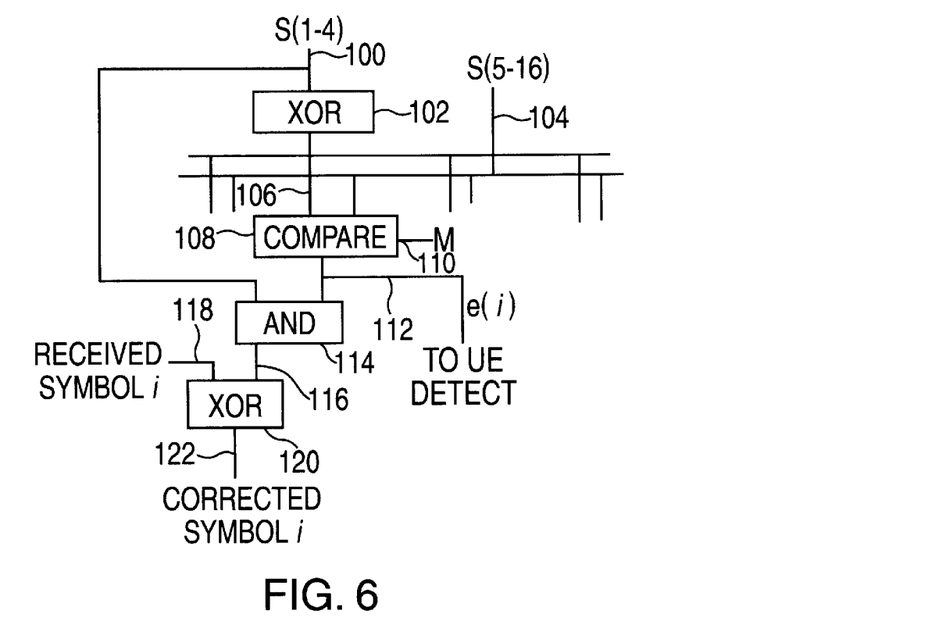
FIG. 6 is a functional block diagram for a method of solving an equation of the present invention in accordance with another embodiment thereof.
Figure 7:
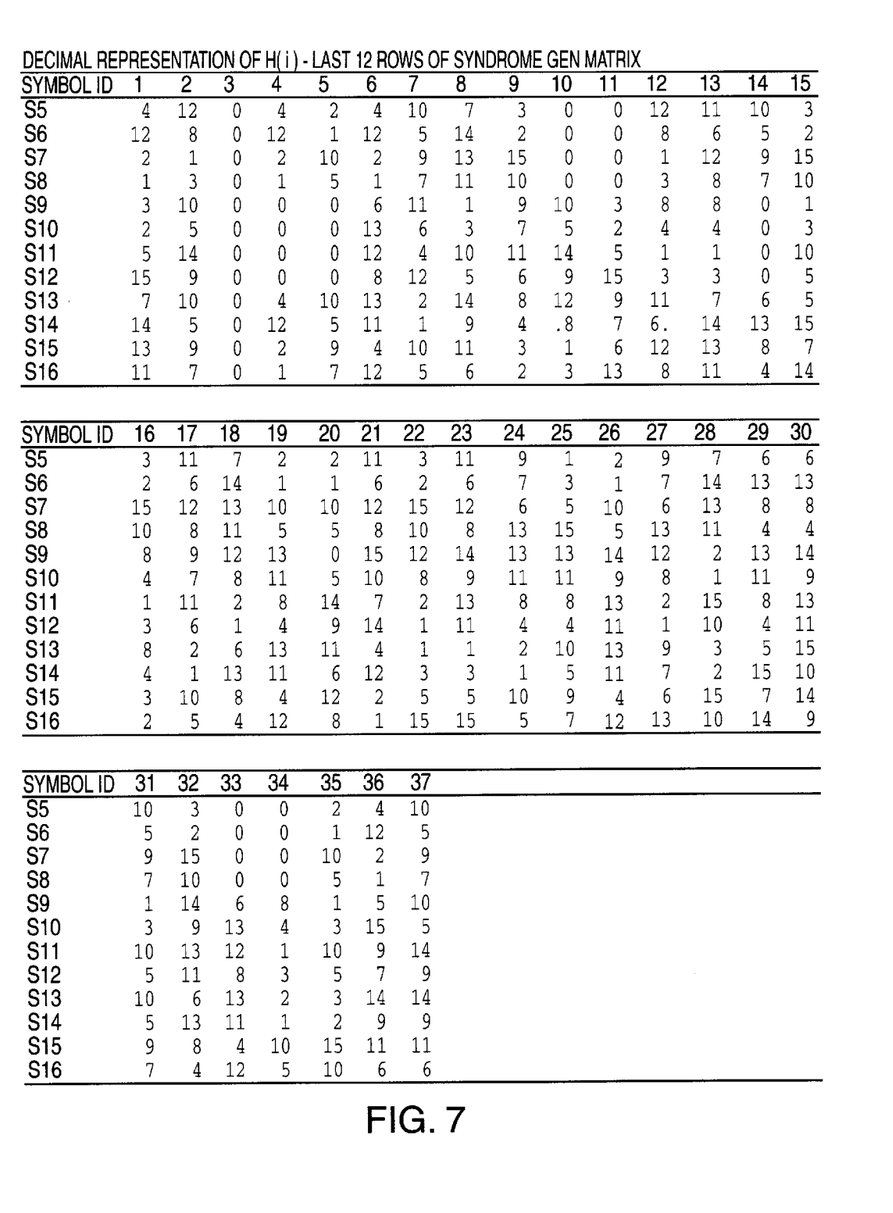
FIG. 7 is a decimal representation of a vector space of the parity check matrix, H(i), $1 \leq i \leq 37$ of the present invention.

Referring now to FIG. 6, an alternative circuit for resolving Eq. 7 is shown. First, S(1–4) is connected to XOR 102 block on a line 100 wherein all 16 possible XOR combinations of S(1–4) are generated on a line 106. Then selective subsets of the output bits from XOR 102 and S(5–16) on a line 104 are supplied to a compare block 108 for comparison. The outputs of XOR 102 can be represented by decimal numbers 0–15, where the binary representation of each decimal number corresponds to the bit pattern of S(1–4) that are XORed together. For example, 1 1 0 1 is the binary representation of 13, and the XOR of S(1, 2, 4) is represented by 13. Now, each row of H(i) can be expressed in decimal numbers 0–15 using the notation described. Matrix H(i) can be converted into a single column of decimal numbers. Referring to FIG. 7, a decimal representation of H(i), $1 \leq i \leq 37$ is shown.

The output bits of XOR 102 selected for the i-th compare block 108 are those represented by the decimal numbers of H(i). For example, (4,12,1,3,2,5,15,7,14,13, 11) is the set of outputs from XOR 102 for the compare block 108 at the first symbol position. The compare function is exactly the same as the one described with reference to FIG. 5.

Uncorrectable Errors

The ECC is designed to correct all single symbol errors. All double symbol errors are detected as uncorrectable errors. Many multiple symbol errors are also detected as uncorrectable errors. If one of the following conditions is met, the uncorrectable errors is set to one.

(1) S is not zero and S(1–4)=0;
(2) S is not zero and none of e(i) is on for all i; or
(3) For M=0, S(1–2) are not both zero and S(3–4) are not both zero.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A digital memory system comprising:
 a memory array with addressable memory locations capable of holding data bit values and check bit values at said locations, said data bit values being arranged as N symbols with m bits per symbol, wherein m is greater than one;
 a check bit generator for generating check bits for memory store operations, said check bit values configured for implementing two separate error correction codes corresponding to two different arrangements of said data bit values;
 a syndrome generator receiving said data bit values and said check bit values from said memory locations for producing a syndrome; and
 an error correction circuit receptive to said syndrome and said data bits for producing therefrom corrected data bits, wherein said error correction circuits are operable to correct single symbol errors and to detect double symbol errors.

2. The digital memory system of claim 1 wherein the two different arrangements of said data bit values comprise data bit values of two bits per symbol and data bit values of four bits per symbol.

3. The digital memory system of claim 1 wherein said check bit values include mode bit values indicative of the arrangement of said data bit values.

4. The digital memory system of claim 1 wherein said mode bit value indicates whether said check bit values comprise either 12 check bit values or 16 check bit values.

5. The digital memory system of claim 1 wherein said check bit generator performs a first logical operation to generate first partial check bits, said check bits being generated in response to said first partial check bits.

6. The digital memory system of claim 1 wherein said check bit generator performs a first logical operation to generate first partial check bits, said check bit generator performs a second logical operation to generate second partial check bits, said check bits being generated in response to said first partial check bits and said second partial check bits.

7. The digital memory system of claim 6 wherein said check bit generator generates said second partial check bits in response to a mode bit value indicative of the arrangement of said data bit values.

8. The digital memory system of claim 1 wherein said syndrome generator performs a first logical operation between a first portion of said check bit values and at mode bit value indicative of an arrangement of said data bit values to define a first resultant; said syndrome being generated in response to a second portion of said check bit values, said data bit values and said first resultant.

9. A method for encoding bits of binary data, comprising encoding said bits of data using an electrical circuit defined by a parity check matrix having the form comprising:

| symbol ID | 1 | 2 | 3 | 4 | 5 | 6 | 7 | 8 | 9 | 10 |
|---|---|---|---|---|---|---|---|---|---|---|
| bit ID | 1234 | 5678 | 111 9012 | 1111 3456 | 1112 7890 | 2222 1234 | 2222 5678 | 2333 9012 | 3333 3456 | 3334 7890 |
| C1 | 1110 | 1100 | 1010 | 0111 | 1110 | 0101 | 1011 | 0001 | 0110 | 0111 |
| C2 | 1001 | 1000 | 0101 | 1110 | 1001 | 1111 | 0110 | 0011 | 1101 | 1110 |
| C3 | 0110 | 0011 | 0111 | 1011 | 0110 | 1110 | 1000 | 1111 | 0100 | 1011 |
| C4 | 1101 | 0010 | 1110 | 0110 | 1101 | 1001 | 0100 | 1010 | 1100 | 0110 |
| C5 | 0000 | 1001 | 0010 | 1001 | 1110 | 1011 | 0000 | 0011 | 0010 | 1111 |
| C6 | 0000 | 0111 | 0001 | 0111 | 1001 | 0110 | 0000 | 0010 | 0001 | 1010 |
| C7 | 0000 | 1101 | 0101 | 1101 | 0110 | 1000 | 0000 | 1010 | 0101 | 1001 |
| C8 | 0000 | 1011 | 1111 | 1011 | 1101 | 0100 | 0000 | 0101 | 1111 | 0111 |
| C9 | 0110 | 1101 | 0000 | 0110 | 1000 | 0110 | 0011 | 1010 | 1100 | 0000 |
| C10 | 1101 | 1011 | 0000 | 1101 | 0100 | 1101 | 0010 | 0101 | 1000 | 0000 |
| C11 | 0100 | 1100 | 0000 | 0100 | 0010 | 0100 | 1010 | 0111 | 0011 | 0000 |
| C12 | 1100 | 1000 | 0000 | 1100 | 0001 | 1100 | 0101 | 1110 | 0010 | 0000 |
| C13 | 1000 | 1000 | 1110 | 0010 | 1000 | 0010 | 1110 | 1000 | 1010 | 1100 |
| C14 | 0100 | 0100 | 1001 | 0001 | 0100 | 0001 | 1001 | 0100 | 0101 | 1000 |
| C15 | 0010 | 0010 | 0110 | 0101 | 0010 | 0101 | 0110 | 0010 | 0111 | 0011 |
| C16 | 0001 | 0001 | 1101 | 1111 | 0001 | 1111 | 1101 | 0001 | 1110 | 0010 |
| symbol ID | 11 | 12 | 13 | 14 | 15 | 16 | 17 | 18 | 19 | 20 |
| bit ID | 4444 1234 | 4444 5678 | 4555 9012 | 5555 3456 | 5556 7890 | 6666 1234 | 6666 5678 | 6777 9012 | 7777 3456 | 7778 7890 |
| C1 | 0011 | 1011 | 1110 | 1000 | 1100 | 1000 | 0000 | 0000 | 1111 | 0011 |
| C2 | 0010 | 0110 | 1001 | 0100 | 1000 | 0100 | 0000 | 0000 | 1010 | 0010 |
| C3 | 1010 | 1000 | 0110 | 0010 | 0011 | 0010 | 0000 | 0000 | 1001 | 1010 |
| C4 | 0101 | 0100 | 1101 | 0001 | 0010 | 0001 | 0000 | 0000 | 0111 | 0101 |
| C5 | 1011 | 1110 | 0001 | 0011 | 1000 | 1100 | 1111 | 0010 | 1111 | 0011 |
| C6 | 0110 | 1001 | 0011 | 0010 | 0100 | 1000 | 1010 | 0001 | 1010 | 0010 |
| C7 | 1000 | 0110 | 1111 | 1010 | 0010 | 0011 | 1001 | 0101 | 1001 | 1010 |
| C8 | 0100 | 1101 | 1010 | 0101 | 0001 | 0010 | 0111 | 1111 | 0111 | 0101 |
| C9 | 0000 | 1101 | 0111 | 0011 | 1100 | 1100 | 0111 | 1010 | 1000 | 1000 |
| C10 | 0000 | 1011 | 1110 | 0010 | 1000 | 1000 | 1110 | 0101 | 0100 | 0100 |
| C11 | 0000 | 1100 | 1011 | 1010 | 0011 | 0011 | 1011 | 0111 | 0010 | 0010 |
| C12 | 0000 | 1000 | 0101 | 0101 | 0010 | 0110 | 1110 | 1110 | 0001 | 0001 |
| C13 | 1000 | 0000 | 0100 | 0010 | 0000 | 0011 | 0101 | 1100 | 1000 | 0101 |
| C14 | 0100 | 0000 | 1100 | 0001 | 0000 | 0010 | 1111 | 1000 | 0100 | 1111 |
| C15 | 0010 | 0000 | 0001 | 0101 | 0000 | 1010 | 1110 | 0011 | 0010 | 1110 |
| C16 | 0001 | 0000 | 0011 | 1111 | 0000 | 0101 | 1001 | 0010 | 0001 | 1001 |
| symbol ID | 21 | 22 | 23 | 24 | 25 | 26 | 27 | 28 | 29 | 30 |
| bit ID | 8888 1234 | 8888 5678 | 8999 9012 | 9999 3456 | 1 9990 7890 | 1111 0000 1234 | 1111 0000 5678 | 1111 0111 9012 | 1111 1111 3456 | 1111 1112 7890 |
| C1 | 0010 | 1101 | 1100 | 0001 | 0111 | 0110 | 1111 | 1000 | 0010 | 1011 |
| C2 | 0001 | 1011 | 1000 | 0011 | 1110 | 1101 | 1010 | 0100 | 0001 | 0110 |
| C3 | 0101 | 1100 | 0011 | 1111 | 1011 | 0100 | 1001 | 0010 | 0101 | 1000 |
| C4 | 1111 | 1000 | 0010 | 1010 | 0110 | 1100 | 0111 | 0001 | 1111 | 0100 |
| C5 | 1101 | 1001 | 0011 | 0110 | 1011 | 0110 | 1000 | 1010 | 0100 | 1101 |
| C6 | 1011 | 0111 | 0010 | 1101 | 0110 | 1101 | 0100 | 0101 | 1100 | 1011 |
| C7 | 1100 | 1101 | 1010 | 0100 | 1000 | 0100 | 0010 | 0111 | 0001 | 1100 |
| C8 | 1000 | 1011 | 0101 | 1100 | 0100 | 1100 | 0001 | 1110 | 0011 | 1000 |
| C9 | 0111 | 1100 | 0111 | 1111 | 0100 | 1000 | 1111 | 1010 | 1110 | 1110 |
| C10 | 1110 | 1000 | 1110 | 1010 | 1100 | 0100 | 1010 | 0101 | 1001 | 1001 |

-continued

| | | | | | | | | | |
|---|---|---|---|---|---|---|---|---|---|
| C11 | 1011 | 0011 | 1011 | 1001 | 0001 | 0010 | 1001 | 0111 | 0110 0110 |
| C12 | 0110 | 0010 | 0110 | 0111 | 0011 | 0001 | 0111 | 1110 | 1101 1101 |
| C13 | 0001 | 1101 | 0000 | 0000 | 0100 | 1111 | 0011 | 0000 | 1101 0110 |
| C14 | 0011 | 1011 | 0000 | 0000 | 1100 | 1010 | 0010 | 0000 | 1011 1101 |
| C15 | 1111 | 1100 | 0000 | 0000 | 0001 | 1001 | 1010 | 0000 | 1100 0100 |
| C16 | 1010 | 1000 | 0000 | 0000 | 0011 | 0111 | 0101 | 0000 | 1000 1100 |

| | symbol ID | 31 | 32 | 33 | 34 | 35 | 36 | 37 |
|---|---|---|---|---|---|---|---|---|
| | bit ID | 1111 | 1111 | 1111 | 1111 | 1111 | 1111 | 1111 |
| | | 2222 | 2222 | 2333 | 3333 | 3334 | 4444 | 4444 |
| | | 1234 | 5678 | 9012 | 3456 | 7890 | 1234 | 5678 |
| | C1 | 0110 | 1010 | 1000 | 0000 | 0000 | 1100 | 0101 |
| | C2 | 1101 | 0101 | 0100 | 0000 | 0000 | 1000 | 1111 |
| | C3 | 0100 | 0111 | 0010 | 0000 | 0000 | 0011 | 1110 |
| | C4 | 1100 | 1110 | 0001 | 0000 | 0000 | 0010 | 1001 |
| | C5 | 1101 | 1110 | 0000 | 1000 | 0000 | 0010 | 1110 |
| | C6 | 1011 | 1001 | 0000 | 0100 | 0000 | 0001 | 1001 |
| | C7 | 1100 | 0110 | 0000 | 0010 | 0000 | 0101 | 0110 |
| | C8 | 1000 | 1101 | 0000 | 0001 | 0000 | 1111 | 1101 |
| | C9 | 0011 | 1100 | 0000 | 0000 | 1000 | 0110 | 0011 |
| | C10 | 0010 | 1000 | 0000 | 0000 | 0100 | 1101 | 0010 |
| | C11 | 1010 | 0011 | 0000 | 0000 | 0010 | 0100 | 1010 |
| | C12 | 0101 | 0010 | 0000 | 0000 | 0001 | 1100 | 0101 |
| | C13 | 0010 | 0000 | 0000 | 0000 | 0000 | 1000 | 1110 |
| | C14 | 0001 | 0000 | 0000 | 0000 | 0000 | 0100 | 1001 |
| | C15 | 0101 | 0000 | 0000 | 0000 | 0000 | 0010 | 0110 |
| | C16 | 1111 | 0000 | 0000 | 0000 | 0000 | 0001 | 1101. |

\* \* \* \* \*